(12) United States Patent
Fukasawa et al.

(10) Patent No.: US 9,383,402 B2
(45) Date of Patent: Jul. 5, 2016

(54) PARTIAL DISCHARGE SENSOR (75) Inventors: Toru Fukasawa, Tokyo (JP); Takashi Ito, Tokyo (JP); Hiroaki Miyashita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 93 days.

(21) Appl. No.: 14/371,394

(22) PCT Filed: Feb. 21, 2012

(86) PCT No.: PCT/JP2012/001148
§ 371 (c)(1),
(2), (4) Date: Jul. 9, 2014

(87) PCT Pub. No.: WO2013/124886
PCT Pub. Date: Aug. 29, 2013

(65) Prior Publication Data
US 2015/0204936 A1    Jul. 23, 2015

(51) Int. Cl.
*G01R 31/02*     (2006.01)
*G01R 31/12*     (2006.01)
*H02B 13/065*   (2006.01)
*H01Q 9/28*      (2006.01)
*G01R 31/14*     (2006.01)
*G01R 31/327*   (2006.01)

(52) U.S. Cl.
CPC ........ *G01R 31/1254* (2013.01); *G01R 31/1272* (2013.01); *G01R 31/1281* (2013.01); *G01R 31/14* (2013.01); *G01R 31/327* (2013.01); *H01Q 9/28* (2013.01); *H01Q 9/285* (2013.01); *H02B 13/065* (2013.01)

(58) Field of Classification Search
CPC ........... G01R 31/1254; G01R 31/1272; G01R 31/1281; G01R 31/14
USPC .................................................. 324/536, 551
See application file for complete search history.

(56) References Cited

U.S. PATENT DOCUMENTS

| | | | | |
|---|---|---|---|---|
| 4,607,394 A * | 8/1986 | Nightingale | ........... | H01Q 1/247 333/238 |
| 6,091,374 A * | 7/2000 | Barnes | ................... | H01Q 9/005 343/767 |
| 2009/0027062 A1* | 1/2009 | Maruyama | ......... | G01R 31/1254 324/544 |
| 2011/0080161 A1 | 4/2011 | Maruyama et al. | | |

FOREIGN PATENT DOCUMENTS

| | | |
|---|---|---|
| JP | H06-174778 A | 6/1994 |
| JP | H09-153725 A | 6/1997 |
| JP | H10-322824 A | 12/1998 |
| JP | 2000-162263 A | 6/2000 |

(Continued)

OTHER PUBLICATIONS

International Search Report; PCT/JP2012/001148; May 29, 2012.

(Continued)

*Primary Examiner* — Vincent Q Nguyen
(74) *Attorney, Agent, or Firm* — Studebaker & Brackett PC (57) ABSTRACT

A partial discharge sensor is configured to have a metal casing 7 disposed outside flange 2a and 2b and a bowtie antenna 8 disposed inside the metal casing 7 in a direction orthogonal to a circumferential direction of the flanges 2a and 2b to thus receive a signal caused by a partial discharge over a wide band with high sensitivity.

8 Claims, 11 Drawing Sheets

(56) References Cited

FOREIGN PATENT DOCUMENTS

| JP | 2001-141773 A | 5/2001 |
|----|---------------|--------|
| JP | 2002-022790 A | 1/2002 |
| JP | 2002-135037 A | 5/2002 |
| JP | 2010-263524 A | 11/2010 |
| JP | 2011-066837 A | 3/2011 |
| JP | 2011-083054 A | 4/2011 |

OTHER PUBLICATIONS

M.D. Judd et al., "A Pulsed GTEM System for UHF Sensor Calibration", IEEE Trans. Instrum. Meas., vol. 47 No. 4, Aug. 1998.

* cited by examiner

PARTIAL DISCHARGE SENSOR

TECHNICAL FIELD

The present invention relates to a partial discharge sensor that detects a partial discharge phenomenon that occurs inside a device in high power equipment such as gas insulated switch (GIS).

BACKGROUND ART

Figure 22:
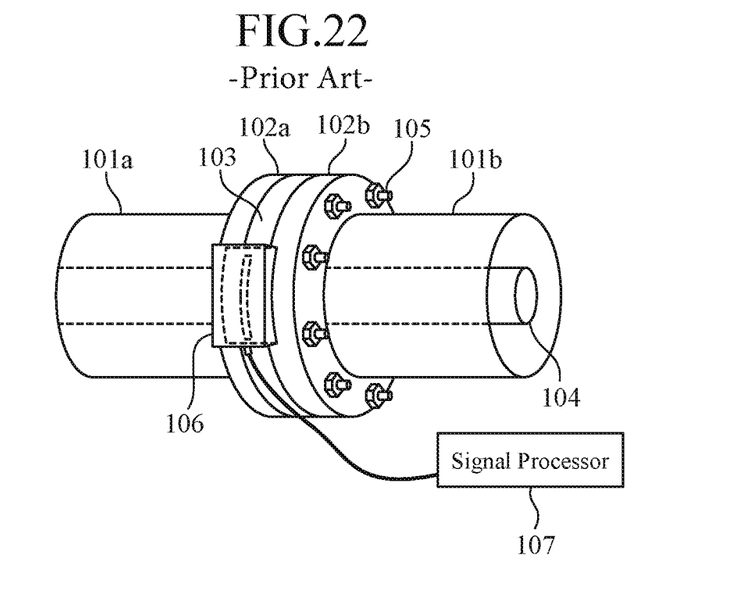
FIG. 22 is a perspective view showing a state where a conventional partial discharge sensor is installed on a GIS.

FIG. 22 shows a state where a conventional partial discharge sensor is installed on a GIS.

Figure 23:
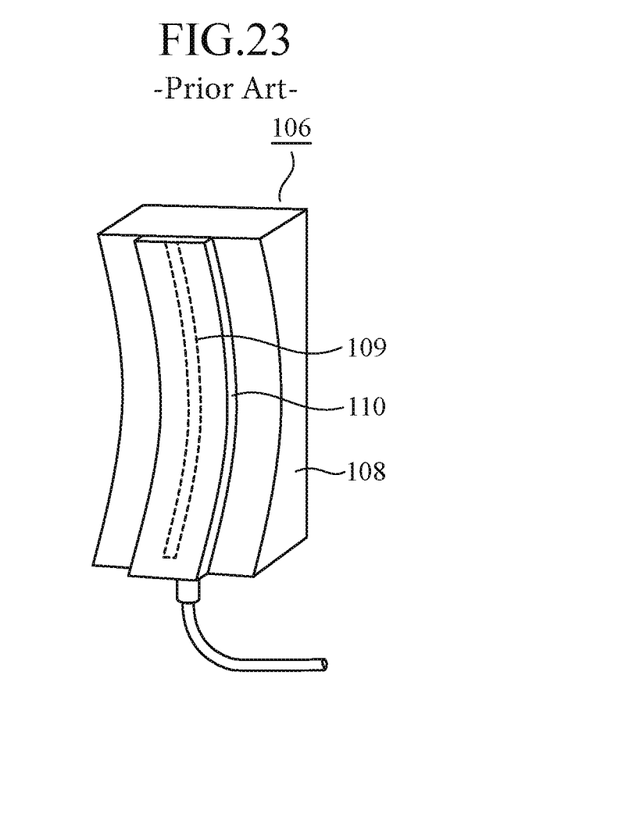
FIG. 23 is a perspective view showing a configuration of the conventional partial discharge sensor.

FIG. 23 shows a configuration of a conventional partial discharge sensor.

In the figures, a flange 102a is formed at an end portion of a conductor tube 101a, and a flange 102b is formed at an end portion of a conductor tube 101b.

An insulating spacer 103 is sandwiched between the flanges 102a and 102b, and holds a high-voltage cable 104 inside the conductor tubes 101a and 101b.

Connection bolts 105 connect the flanges 102a and 102b with each other.

In this manner, the high-voltage cable 104 is placed inside a tubular closed space formed by the conductor tube 101, and the closed space is filled with a gas that enhances insulation thereof.

The partial discharge sensor 106 is installed on the insulating spacer 103 sandwiched between the flanges 102a and 102b, and transmits a signal detected by the partial discharge sensor 106 to a signal processor 107, to thereby detect a partial discharge that occurs within the GIS.

The partial discharge sensor 106 operates a slot 109 disposed on a conductive casing 108 as a slot antenna.

When an electrical length of the slot antenna that takes a dielectric constant of an elastic member 110 into account is set to a half wavelength of a wavelength to be used, an antenna with high sensitivity can be configured (see Patent Document 1 below).

PRIOR ART DOCUMENT

Patent Document

Patent Document 1: Japanese Unexamined Patent Application Publication No. 2011-83054

SUMMARY OF THE INVENTION

Problems to be Solved by the Invention

The conventional partial discharge sensor is configured as mentioned above, and uses single resonance characteristics of the slot 109. Thus, sensitivity of the antenna for frequencies other than a resonance frequency is deteriorated.

Generally, a signal over a wide band from 500 to 1500 MHz is generated by the partial discharge in the GIS is. Thus, a single resonance type slot antenna that is sensitive to only a specific frequency cannot receive the signal of the partial discharge with high sensitivity.

Thus, there is a problem such that in order to receive the signal of the partial discharge with high sensitivity, a wide band antenna having high sensitivity over the wide band from 500 to 1500 MHz is required.

The present invention is made to solve the aforementioned problems, and an object of the invention is to obtain a partial discharge sensor that receives the signal of the partial discharge over the wide band with high sensitivity.

Means for Solving the Problems

A partial discharge sensor according to the invention includes: a metal casing disposed on an outer side of first and second flanges, having a longitudinal direction in a circumferential direction of the first and second flanges and also a width direction in a thickness direction of an insulating spacer, and having one surface opened on the side of the first and second flanges; and a bowtie antenna disposed inside the metal casing, and disposed in a direction orthogonal to the circumferential direction of the first and second flanges, and having an overlapping portion with the first and second flanges.

Effect of the Invention

According to the invention, when a partial discharge occurs inside high power equipment, a signal caused by the partial discharge is detected by the bowtie antenna using the insulating spacer covered by the metal casing as a pseudo slot opening.

In principle, the bowtie antenna can receive the signal with high sensitivity over an infinite wide band above the lowest frequency.

In addition, stray capacitances are respectively produced between the first and second flanges and the bowtie antenna, between the meal casing and the bowtie antenna, and between the first and second flanges and the metal casing. The lowest frequency is lowered due to the stray capacitances.

Therefore, there is an advantageous effect such that a partial discharge sensor that receives the signal caused by the partial discharge over the wide band with high sensitivity can be obtained.

BEST MODE FOR CARRYING OUT THE INVENTION

In the following, in order to describe the present invention in more detail, embodiments for carrying out the invention will be described with reference to the accompanying drawings.

Embodiment 1

Figure 1:
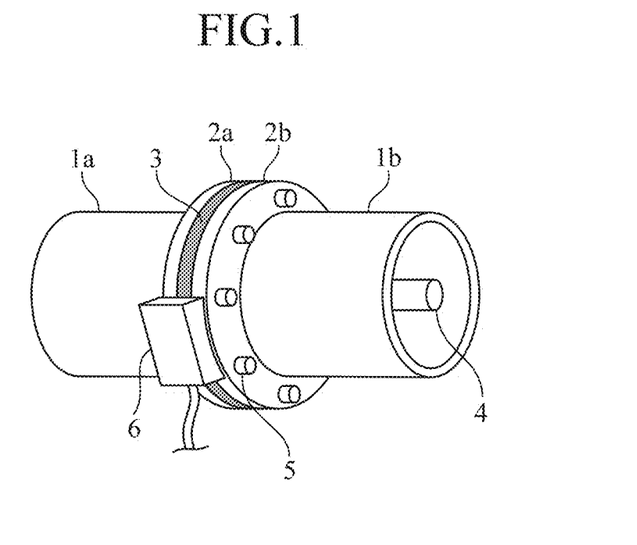
FIG. 1 is a perspective view showing a state where a partial discharge sensor is installed on a GIS according to Embodiment 1 of the present invention.

FIG. 1 shows a state where a partial discharge sensor is installed on a GIS according to Embodiment 1 of the invention.

Figure 2:
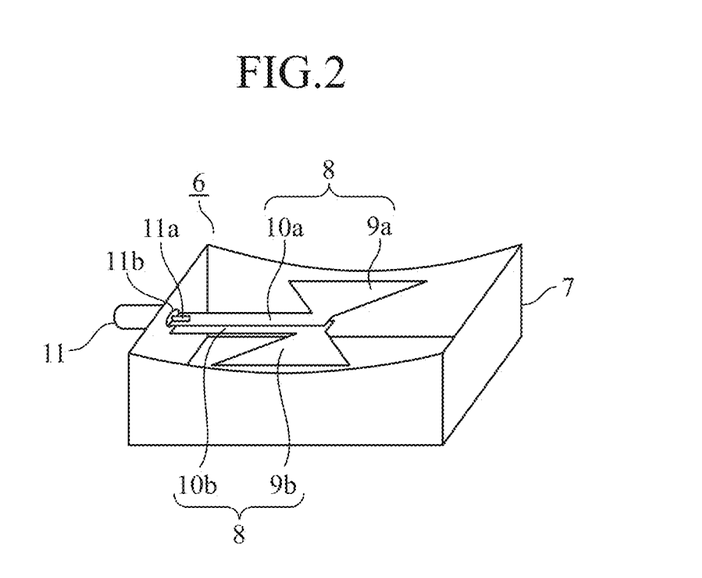
FIG. 2 is a perspective view showing a configuration of the partial discharge sensor according to Embodiment 1 of the invention.

FIG. 2 shows a configuration of the partial discharge sensor according to Embodiment 1 of the invention.

In the figures, a flange 2a is formed at an end portion of a conductor tube 1a, and a flange 2b is formed at an end portion of a conductor tube 1b.

An insulating spacer 3 is sandwiched between the flanges 2a and 2b, and holds a high-voltage cable 4 inside the conductor tubes 1a and 1b.

Connection bolts 5 connect the flanges 2a and 2b with each other.

Figure 3:
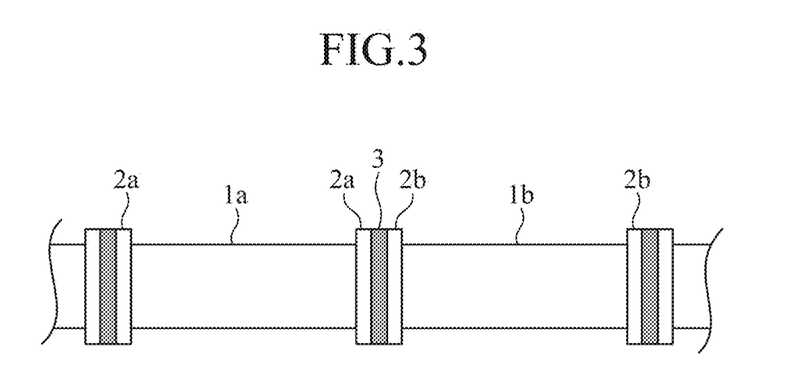
FIG. 3 is a diagram showing a schematic configuration of conductor tubes.

FIG. 3 shows a schematic configuration of the conductor tubes.

As shown in FIG. 3, the high-voltage cable 4 is placed in a tubular closed space formed by the conductor tubes 1a and 1b. The closed space is filled with a gas that enhances insulation thereof.

The conductor tubes 1a and 1b are divided into segments, and the flanges 2a and 2b are respectively disposed on both ends of each segment.

In FIG. 1, a partial discharge sensor 6 is disposed on the outer side of the flanges 2a and 2b sandwiching the insulating spacer 3.

In FIG. 2, a metal casing 7 has a substantially rectangular parallelepiped shape with one surface opened and the other five surfaces hermetically sealed.

The one opened surface of the metal casing 7 is formed into a curved shape to closely contact along the curvature of the flanges 2a and 2b such that the longitudinal direction of the metal casing 7 is aligned with the circumferential direction of the flanges 2a and 2b.

The length of the metal casing 7 in the longitudinal direction is substantially the same dimension as the distance between the connection bolts 5 in the flanges 2a and 2b.

The length of the metal casing 7 in the width direction is substantially the same dimension as the sum of the thicknesses of the flanges 2a and 2b and the insulating spacer 3.

A bowtie antenna 8 is placed near the center of the metal casing 7 in the longitudinal direction and adjacent to the opened surface so as to deal with a polarized wave in a direction orthogonal to the longitudinal direction.

The bowtie antenna 8 is disposed in such a manner that the vertexes of the two triangular conductors 9a and 9b face each other. Also, the bases corresponding to the vertexes facing each other are disposed to face the inner walls of the metal casing 7, and sufficiently adjacent to the inner walls in comparison with the wavelength.

One end of a stripline 10a is integrally formed with the vertex of the triangular conductor 9a, and the other end of the stripline 10a is connected to a signal part 11a of a connector 11 disposed in the metal casing 7.

One end of the stripline 10b is integrally formed with the vertex of the triangular conductor 9b, and the other end of the stripline 10b is connected to a ground part 11b of the connector 11 that is connected to the metal casing 7.

The stripline 10a serving as a signal line and the stripline 10b serving as a ground line are each disposed along the longitudinal direction of the metal casing 7.

Next, an operation thereof will be described.

Figure 4:
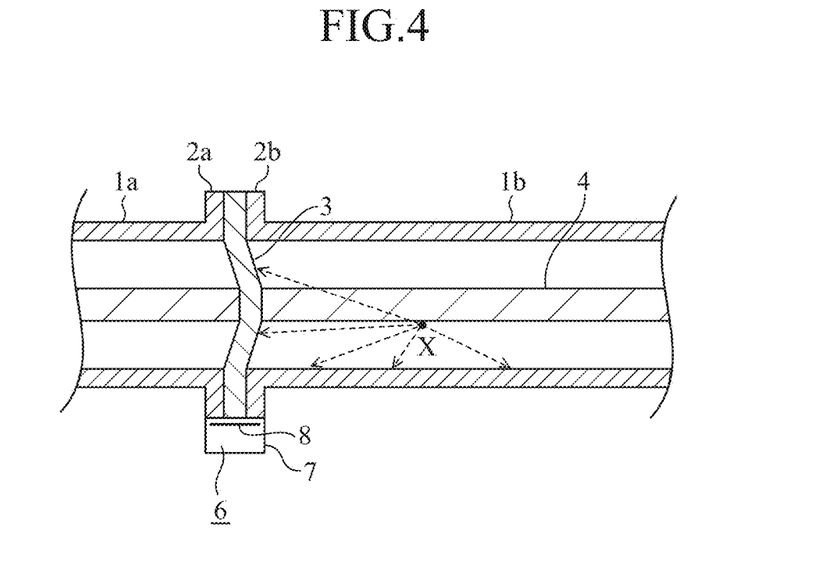
FIG. 4 is a cross-sectional view showing a case where a partial discharge occurs inside the GIS.

FIG. 4 shows a case where a partial discharge occurs inside the GIS.

When the partial discharge occurs at a point X of the high-voltage cable 4, electromagnetic waves of 500 to 1500 MHz as illustrated with broken lines are generated inside the conductor tube 1b.

Part of the electromagnetic waves are incident on the insulating spacer 3 and emitted from a portion sandwiched between the flanges 2a and 2b to the outside.

Because the partial discharge sensor 6 is disposed on the outer side of the flanges 2a and 2b sandwiching the insulating spacer 3, it detects a signal of the electromagnetic waves passing through the insulating spacer 3 by means of the bowtie antenna 8, and transmits the detected signal to a signal processor (not shown). Thus, the partial discharge that occurs inside the GIS is detected.

Figure 5:
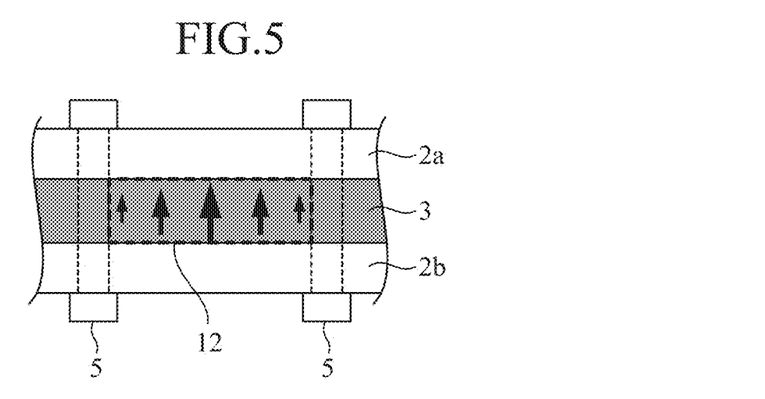
FIG. 5 is a schematic diagram showing a pseudo slot opening disposed in an insulating spacer.

FIG. 5 is a schematic view in which the flanges 2a and 2b side is viewed from the partial discharge sensor 6.

In the typical GIS, the thickness of the insulating spacer 3 is about 40 mm, and the distance between the connection bolts 5 is about 180 mm. As a result, it is regarded that the inside and outside of the GIS are connected with each other through a slot opening 12 of 40*180 mm in a pseudo manner.

In the slot opening 12, an electric field is generated in the width direction, and affected by the connection bolts 5 to be distributed to become maximum in the center portion in the longitudinal direction. This situation will be illustrated by arrows in FIG. 5. The length of the arrow represents the electric field intensity, and the direction of the arrow represents the direction of the electric field.

Figure 6:
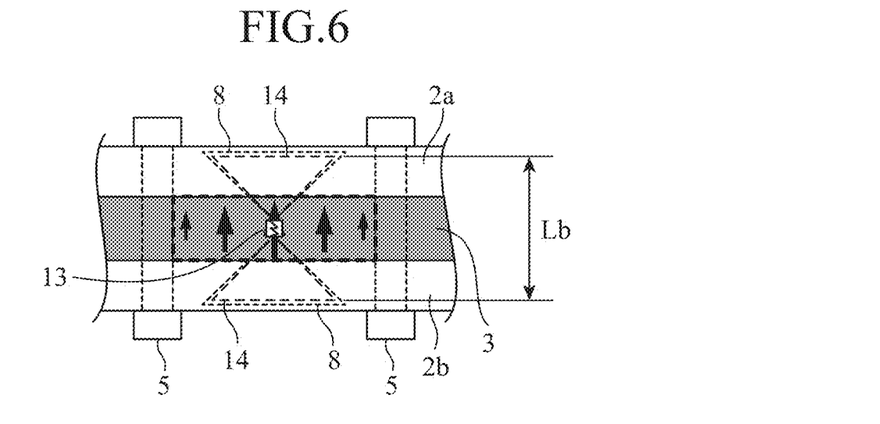
FIG. 6 is a schematic view of overlapping portions between flanges and a bowtie antenna.

FIG. 6 is a schematic diagram showing a state where the bowtie antenna 8 is installed at a portion of the flanges 2a and 2b.

A side of the striplines 10a and 10b of the bowtie antenna 8 is schematically illustrated by a load resistance 13.

The maximum value of a length Lb of the bowtie antenna 8 is a dimension that adds the thicknesses of the flanges 2a and 2b to the thickness of the insulating spacer 3.

In a typical GIS, a thickness of each of the flanges 2a and 2b is about 25 mm, and thus the maximum value of the length Lb is about 90 mm. The length Lb larger than the dimension of the maximum value leads to protrusion of the bowtie antenna 8 to the outside of the flanges 2a and 2b, so that there occurs a failure that easily receives noise from the outside of the GIS.

The bowtie antenna generally has wideband characteristics, and has an infinite band in principle above the lowest frequency fL. The lowest frequency fL is mostly determined by a frequency of which the quarter (¼) wavelength is the same as the length Lb. Specifically, it is represented by fL=C/(Lb×4) [Hz], where C is the speed of light. Thus, fL=800 MHz is obtained when Lb=90 mm.

On the other hand, in order to detect the partial discharge with high sensitivity, a band of 500 to 1500 MHz is required, and thus the lowest frequency fL of the bowtie antenna needs to be lowered to a frequency of 500 MHz or less.

Figure 7:
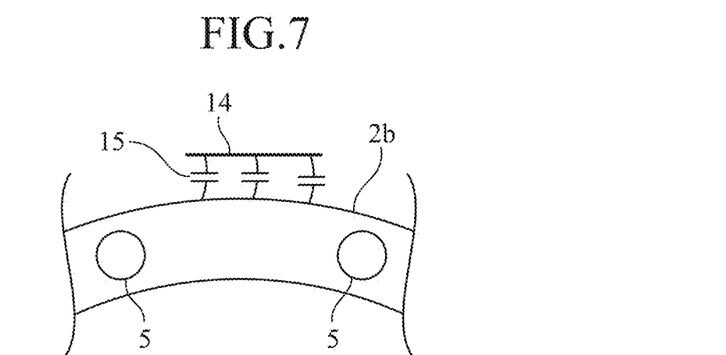
FIG. 7 is a schematic view showing a stray capacitance between the flanges and bowtie antenna.

In a configuration shown in FIG. 6, the bowtie antenna 8 has overlapping portions 14 with the flanges 2a and 2b. As shown in FIG. 7, a stray capacitance 15 is produced between the flanges 2a and 2b and the bowtie antenna 8 due to the overlapping portions 14.

The larger an area of the overlapping portions 14 and the smaller a distance between the flanges 2a and 2b and the bowtie antenna 8, the larger the stray capacitance 15. For antenna characteristics, an antenna effective height within a G-TEM cell is used as an index.

On the other hand, because the lowest frequency fL of the bowtie antenna is reduced in inverse proportion to the stray capacitance, there is an advantageous effect such that an increase of the stray capacitance lowers the lowest frequency fL. Since the length Lb of the bowtie antenna 8 is secured to the maximum within a range not protruding from the flanges 2a and 2b, it becomes possible to maximize the stray capacitance, and to reduce the lowest frequency fL, whereby it is possible to configure an antenna with high sensitivity from a lower frequency.

Figure 8:
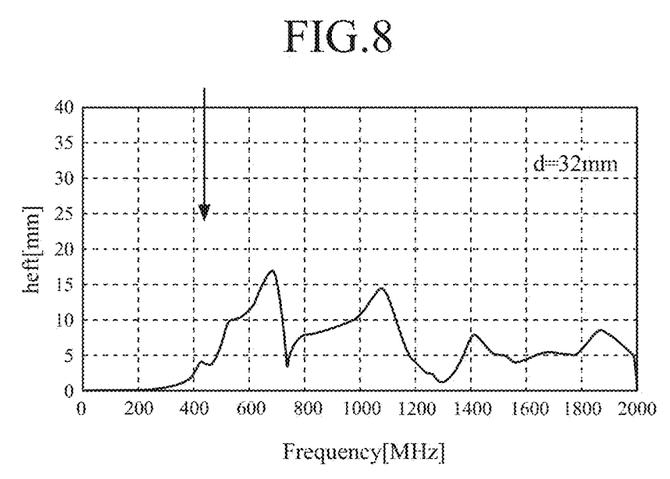
FIG. 8 is a characteristic diagram showing antenna characteristics in a case where a distance between the flange and the bowtie antenna is set to 32 mm.
Figure 9:
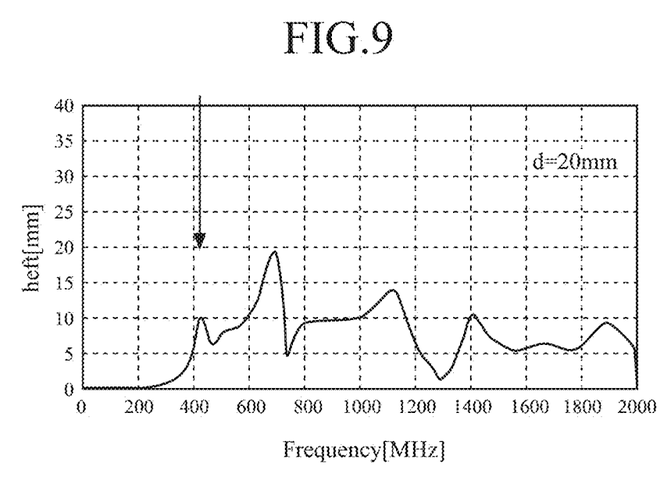
FIG. 9 is a characteristic diagram showing antenna characteristics in a case where the distance between the flange and the bowtie antenna is set to 20 mm.
Figure 10:
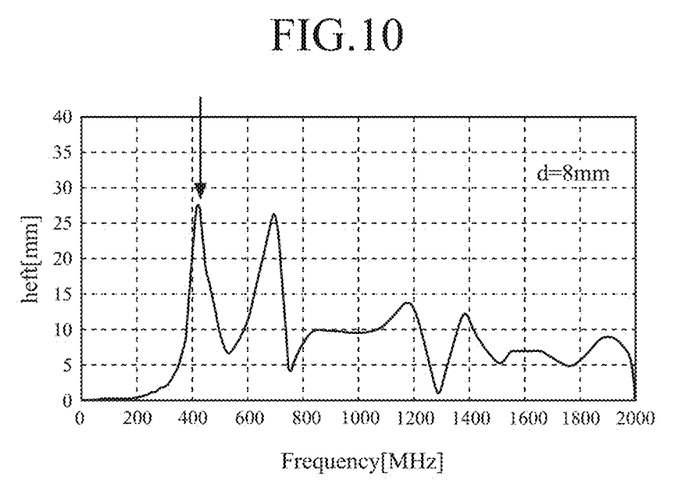
FIG. 10 is a characteristic diagram showing antenna characteristics in a case where the distance between the flange and the bowtie antenna is set to 8 mm.

FIG. 8 to FIG. 10 show antenna characteristics where a distance d between the flanges 2a and 2b and the bowtie antenna 8 is changed. The length Lb is secured to the maximum to an extent not protruding from the flanges 2a and 2b.

From FIG. 8 to FIG. 10, when the distance d is shorter than 20 mm, resonance characteristics as pointed by an arrow in the figure are observed noticeably around 500 MHz band that is a frequency on the lower side, whereby it can be confirmed that the antenna effective height is largely enhanced. Here, d=20 mm corresponds to a 1/30 wavelength at the 500 MHz band.

Thus, it can be confirmed that the distance d is preferably set to a distance not larger than about the 1/30 wavelength.

Incidentally, an evaluation for the antenna effective height within the G-TEM cell is described in the following document and the like, and an index of this evaluation is a typical one as an index for the partial discharge sensor for the GIS.

"M. D. Judd," A Pulsed GTEM System for UHF Sensor Calibration, "IEEE Trans. Instrum. Meas., vol. 47, no. 4, August 1998."

Figure 11:
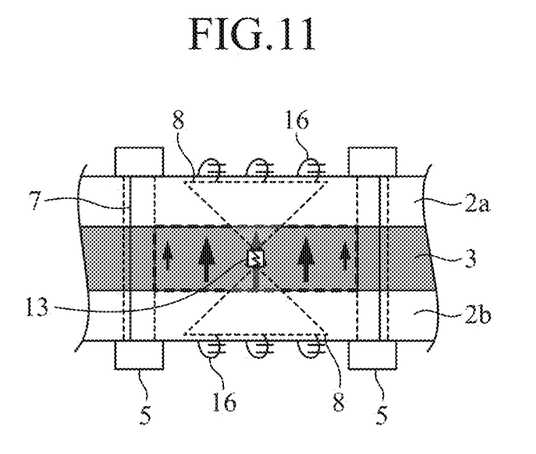
FIG. 11 is a schematic view showing a stray capacitance between a metal casing and the bowtie antenna.

FIG. 11 is a schematic view where the metal casing 7 is attached to the bowtie antenna 8 in FIG. 6.

A distance between the base of the bowtie antenna 8 and the metal casing 7 is sufficiently short compared to the wavelength at the lowest frequency fL=800 MHz of the bowtie antenna 8. In one example, the distance of about 10 mm is provided.

Because of this, a stray capacitance 16 is produced between the bowtie antenna 8 and the metal casing 7.

Figure 12:
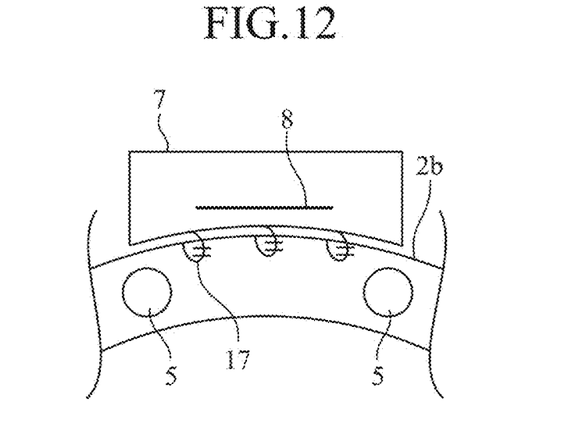
FIG. 12 is a schematic view showing a stray capacitance between the flanges and the metal casing.

On the other hand, as shown in FIG. 12, the metal casing 7 is in close contact with the flanges 2a and 2b, and thus a stray capacitance 17 is also produced between the metal casing 7 and the flanges 2a and 2b.

These stray capacitances 16 and 17 contribute to a direction that increases the stray capacitance 15 between the bowtie antenna 8 and the flanges 2a and 2b, whereby it becomes possible to further reduce the lowest frequency fL of the bowtie antenna.

In order to lower the lowest frequency fL of the bowtie antenna 8 to the maximum, the length Lb needs to be secured to the maximum within a range not protruding from the flanges 2a and 2b. Thus, the optimum width of the metal casing 7 is a length obtained by adding the thickness of the insulating spacer 3 to the thicknesses of the flanges 2a and 2b.

When the width of the metal casing 7 is increased to a range protruding from the flanges 2a and 2b, a gap between the flanges 2a and 2b and the metal casing 7 is increased, so that a noise propagation amount from the outside of the GIS into the inside of the metal casing 7 is increased, and thus detection sensitivity for the partial discharge is degraded.

On the other hand, as shown in FIG. 5, the electric field in the slot opening 12 is distributed over the whole longitudinal direction thereof. Thus, the reception sensitivity can be improved by increasing the length of the metal casing 7 in the longitudinal direction along the outer circumferential direction of the flanges 2a and 2b to an extent that covers the slot opening 12 corresponding to the distance between the connection bolts 5.

An image current in the opposite direction of the current on the bowtie antenna 8 is induced on the metal surface of the metal casing 7 opposite to the opened surface. Thus, a predetermined distance needs to be provided between the corresponding metal surface and the bowtie antenna 8. In one example, it can be confirmed that a sufficient performance can be obtained when a distance not smaller than a 1/10 wavelength at the lowest frequency fL is provided.

On the other hand, at the upper limit frequency, a length not longer than a half (½) wavelength thereof should be provided.

This is because the electric waves reflected by the metal surface are synthesized in reverse phase on the opening surface side, which causes sensitivity deterioration on the opening surface side.

The 1/10 wavelength at 500 MHz that is the lowest frequency fL is about 60 mm, and the ½ wavelength at 1500 MHz that is the upper limit frequency is about 100 mm.

By setting a distance between the metal surface on the opposite side of the opened surface and the bowtie antenna 8 to be 60 mm or more and 100 mm or less, it is possible for the antenna to have high sensitivity over the range from 500 to 1500 MHz.

As described above, according to Embodiment 1, when the partial discharge occurs in the GIS, the bowtie antenna 8 detects the signal caused by the partial discharge using the insulating spacer 3 covered by the metal casing 7 as the pseudo slot opening 12.

In principle, the bowtie antenna 8 can receive the signal with high sensitivity over the infinite wide band in the frequency above the lowest frequency fL.

In addition, the stray capacitances 15 to 17 are respectively produced between the flanges 2a and 2b and the bowtie antenna 8, between the metal casing 7 and the bowtie antenna 8, and between the flanges 2a and 2b and the metal casing 7, and the lowest frequency fL is lowered by the stray capacitances 15 to 17.

Therefore, a partial discharge sensor that receives the signal caused by the partial discharge over the wide band with high sensitivity can be obtained.

In addition, the length of the metal casing 7 in the width direction corresponds to a length that is a sum of the thicknesses of the flanges 2a and 2b and the insulating spacer 3. Thus, degradation of the detection sensitivity for the partial discharge caused by the noise from the outside of the GIS can be prevented, and the stray capacitance 15 between the flanges 2a and 2b and the bowtie antenna 8 can be increased to the maximum, whereby the lowest frequency can be lowered.

Further, the length of the metal casing 7 in the longitudinal direction corresponds to the distance between the connection bolts 5 of the flanges 2a and 2b. Thus, though the electric field caused by the partial discharge is decreased in the vicinity of the connection bolts 5 due to the connection bolts 5, the length of the metal casing 7 in the longitudinal direction corresponds to the distance (slot opening) between the connection bolts 5, whereby the electric field density caused by the partial discharge can be enhanced to thereby enhance the reception sensitivity.

Furthermore, the surfaces of the metal casing 7 other than the opening surface are shielded by metal, and thus unnecessary noise reaching from the outside of the GIS to the bowtie antenna 8 can be blocked; as a result, the partial discharge inside the GIS can be detected with high sensitivity.

Embodiment 2

Figure 13:
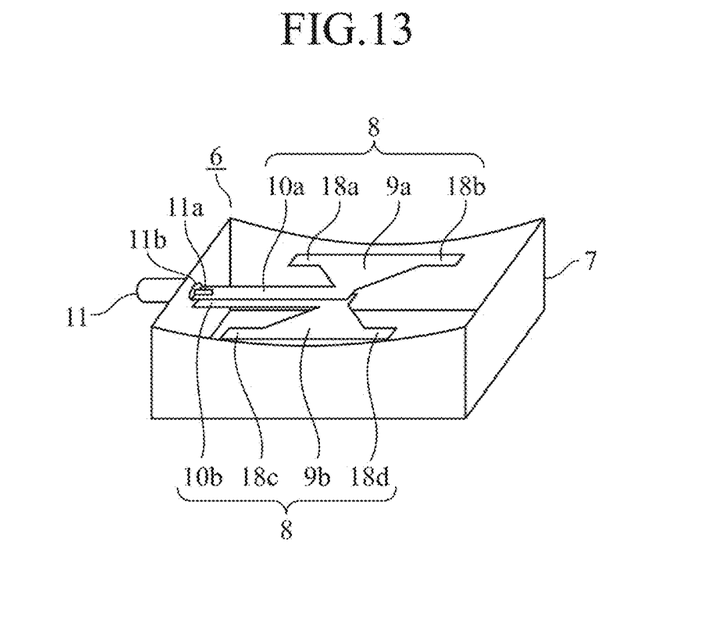
FIG. 13 is a perspective view showing a configuration of a partial discharge sensor according to Embodiment 2 of the invention.

FIG. 13 shows a configuration of a partial discharge sensor according to Embodiment 2 of the present invention.

In the figure, protruding conductors 18a and 18b are disposed on both ends of the base of a triangular conductor 9a and extend along the longitudinal direction of a metal casing 7.

Protruding conductors 18c and 18d are disposed on both ends of the base of a triangular conductor 9b and extend along the longitudinal direction of the metal casing 7.

The other components are similar to those in FIG. 2, and thus redundant explanations thereof will be omitted.

Next, an operation thereof will be described.

As shown in FIG. 13, when the protruding conductors 18a and 18b are disposed on both ends of the base of the triangular conductor 9a, and the protruding conductors 18c and 18d are disposed on both ends of the base of the triangular conductor 9b, the area of the overlapping portions 14 shown in FIG. 6 is increased, whereby the stray capacitance 15 between the flanges 2a and 2b and the bowtie antenna 8 can be increased. Similarly, the stray capacitance 16 between the metal casing 7 and the bowtie antenna 8 can also be increased.

As a result, the lowest frequency fL of the bowtie antenna 8 can be lowered more easily than that in Embodiment 1.

As described above, according to Embodiment 2, the stray capacitances between the flanges 2a and 2b and the bowtie antenna 8, and between the metal casing 7 and the bowtie antenna 8 can be increased, whereby the partial discharge sensor that receives the signal over a wider band with high sensitivity can be obtained.

Embodiment 3

Figure 14:
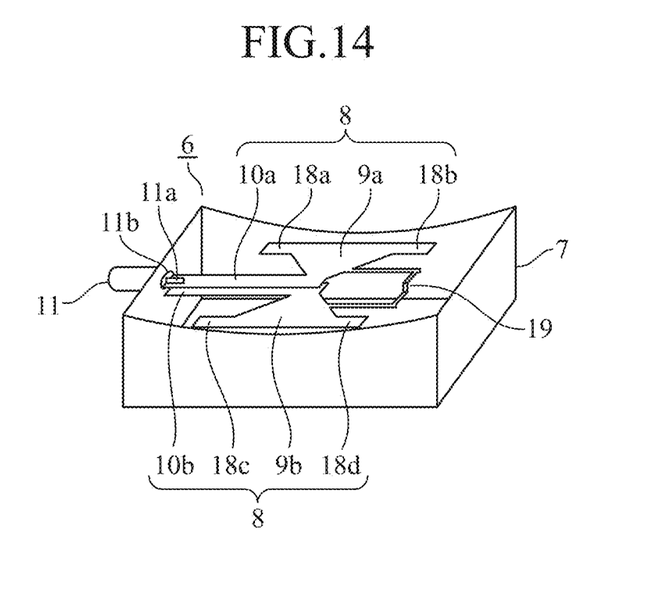
FIG. 14 is a perspective view showing a configuration of a partial discharge sensor according to Embodiment 3 of the invention.

FIG. 14 shows a configuration of a partial discharge sensor according to Embodiment 3 of the present invention.

In the figure, a short stub (short-circuiting line) 19 has an electrical length corresponding to a quarter length at a center frequency within a frequency band to be used, and is formed integral with triangular conductor 9a and 9b so as to connect the vertex portions of the triangular conductor 9a and 9b with each other.

The other components are similar to those in FIG. 13, and thus redundant explanations thereof will be omitted.

Next, an operation thereof will be described.

In FIG. 14, an impedance of the short stub 19 viewed from a bowtie antenna 8 is ideally infinite at the center frequency. It appears to be inductive at frequencies lower than the center frequency and capacitive at frequencies higher than the center frequency.

The bowtie antenna 8 exhibits series resonance characteristics at a frequency near the lowest frequency fL. Further, due to the effect of the stray capacitance, the resistance during resonance has a greatly lower resistance (value) than 70Ω that is a value of a normal dipole one.

Figure 15:
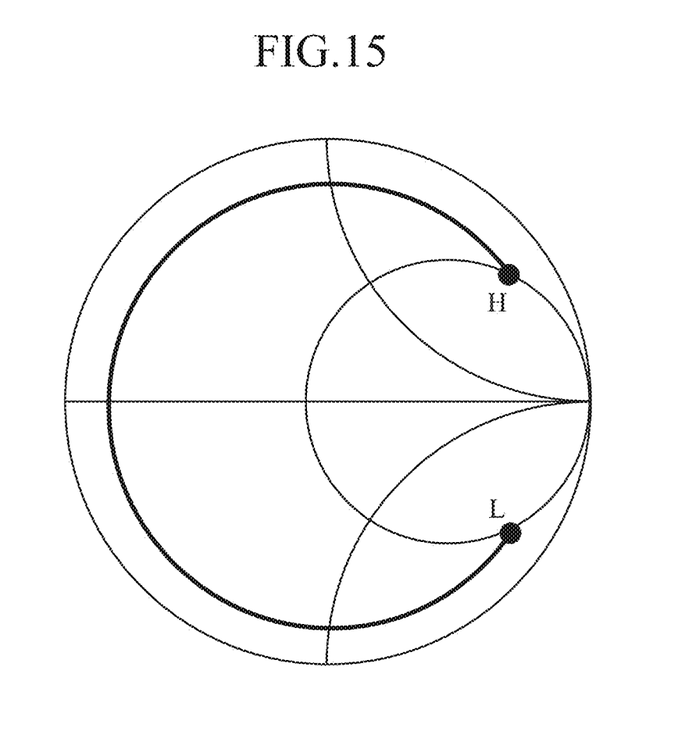
FIG. 15 is a Smith chart showing impedance characteristics of the bowtie antenna.

FIG. 15 shows a Smith chart showing the impedance characteristics of the bowtie antenna 8 that are denoted by Za. In the figure, L denotes the lower limit of the frequency band to be used, and H denotes the upper limit thereof.

Figure 16:
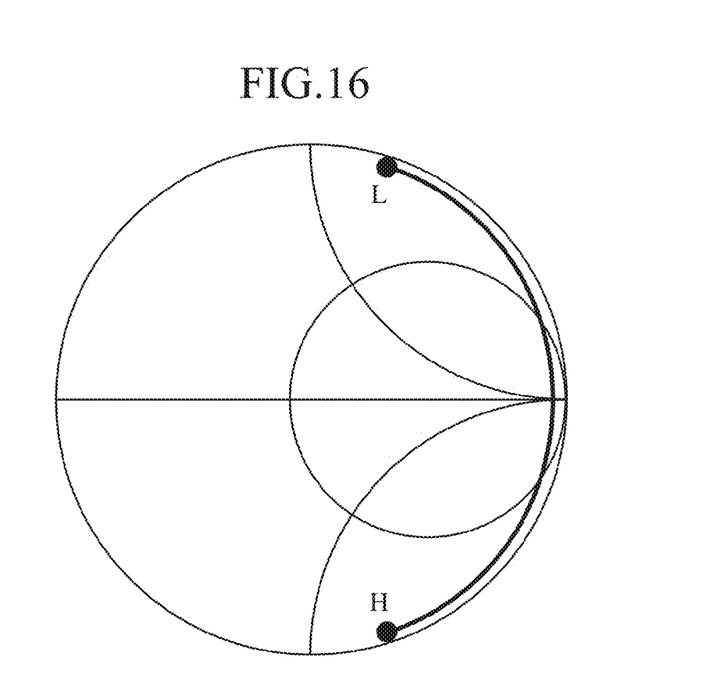
FIG. 16 is a Smith chart showing impedance characteristics of a short stub.

FIG. 16 shows a Smith chart showing the impedance of the short stub 19 viewed from the bowtie antenna 8 that is denoted by Zs. A substantially infinite impedance is provided at the center frequency within the band, indicating to be inductive at frequencies lower than the center frequency and capacitive at frequencies higher than the center frequency.

Figure 17:
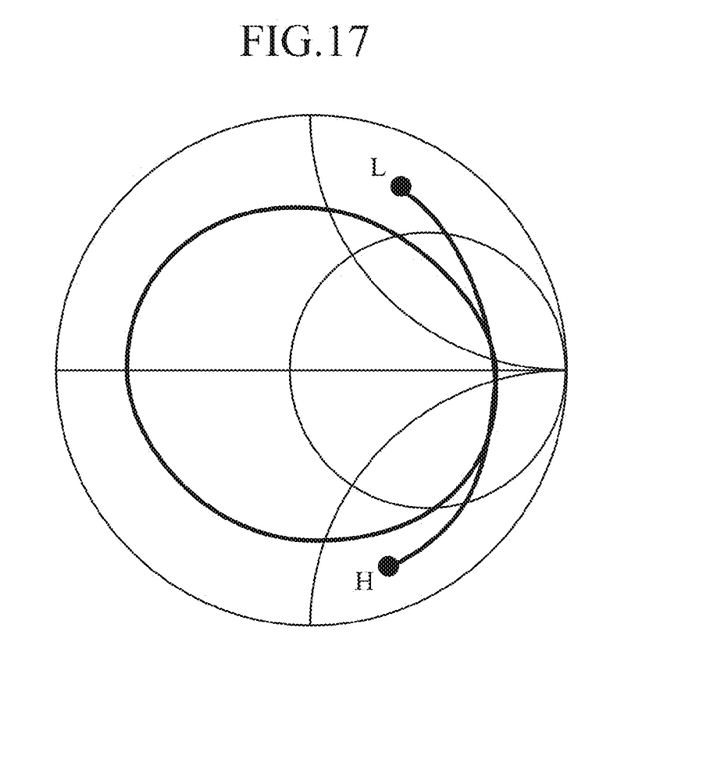
FIG. 17 is a Smith chart showing combined impedance characteristics of the short stub and the bowtie antenna.

When a combined impedance of the bowtie antenna 8 and short stub 19 is denoted by Zt, Zt is represented by Zt=Za×Zs/(Za+Zs), resulting in a parallel combined one of Za and Zs.

FIG. 17 shows the impedance Zt represented on a Smith chart.

The reactance components of the impedance Za and impedance Zs tend to offset each other, and thus the impedance locus of Zt is closer to the center than that of Za.

In this manner, the average reflection characteristics within the frequency band to be used is improved compared to Za, whereby impedance mismatching loss is reduced, and thus a partial discharge sensor with high average sensitivity over the frequency band to be used can be established.

On the other hand, the stray capacitance is produced between the high-voltage cable 4 and the bowtie antenna 8 through the slot opening 12 shown in FIG. 5, and a high voltage is induced in the bowtie antenna 8 at a commercial frequency band to be transmitted in the high-voltage cable 4.

The high voltage induced in the bowtie antenna 8 might adversely affect a signal processor and the like of the partial discharge sensor 6.

In order to prevent this, the two triangular conductors 9a and 9b forming the bowtie antenna 8 have only to be conducted at the commercial low frequency used in the high-voltage cable 4.

The low frequency used in the high-voltage cable 4 is usually 50 Hz or 60 Hz, and by providing the short stub 19, the two triangular conductors 9a and 9b of the bowtie antenna 8 is substantially short circuited at the low frequency.

Because of that, the high voltage can be prevented from being generated in the bowtie antenna 8, whereby the adverse effect of the partial discharge sensor 6 to the signal processor can be prevented.

That is, because of the short stub 19, two effects of improving the sensitivity of the partial discharge sensor 6 and suppressing the generation of the high voltage can be obtained at the same time.

In this case, the electrical length of the short stub 19 is λ/4 of the center frequency; however, when it is set to be λ/4 of a frequency within the frequency range from the lower limit and the upper limit, substantially the same effect can be obtained.

As described above, according to Embodiment 3, there is provided the short stub 19 that has the electrical length which is the quarter wavelength at the center frequency within the frequency band to be used, and that connects the vertex portions of the triangular conductors 9a and 9b with each other. Thus, the average reflection characteristics within the frequency band to be used are improved and the impedance mismatching loss is reduced, whereby the partial discharge sensor 6 with high sensitivity can be obtained.

Additionally, while the high voltage is induced in the bowtie antenna 8 in the commercial frequency band in relation to the high-voltage cable 4, the triangular conductors 9a and 9b of the bowtie antenna 8 are substantially short circuited at the low frequency. Therefore, the signal processor and the like of the partial discharge sensor 6 can be prevented from being adversely affected by the high voltage induced in the bowtie antenna 8.

Embodiment 4

Figure 18:
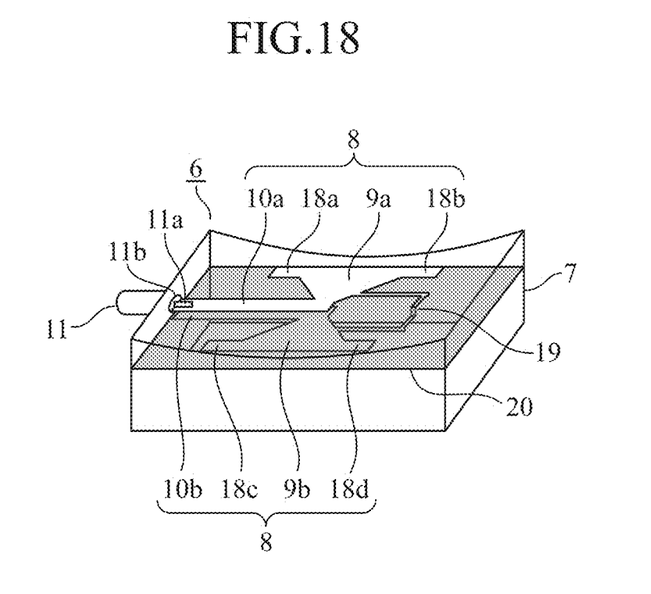
FIG. 18 is a perspective view showing a configuration of a partial discharge sensor according to Embodiment 4 of the invention.

FIG. 18 shows a configuration of a partial discharge sensor in Embodiment 4 of the present invention.

In the figure, members of a bowtie antenna 8, and a short stub 19 are disposed on front and back surfaces of a dielectric substrate 20.

The other components are the same as those shown in FIG. 14, and thus redundant descriptions thereof will be omitted.

Next, an operation thereof will be described.

In FIG. 18, a triangular conductor 9a, a stripline 10a, and protruding conductors 18a and 18b forming a signal line of the bowtie antenna 8, as well as the side of the short stub 19 to be connected to the triangular conductor 9a are disposed on the front surface of a dielectric substrate 20.

In addition, a triangular conductor 9b, a stripline 10b, and protruding conductors 18c and 18d forming a ground line of the bowtie antenna 8, as well as the side of the short stub 19 to be connected to the triangular conductor 9b are disposed on the back surface of the dielectric substrate 20.

In such a way, because the components are formed to be flat, they can be easily formed on the dielectric substrate 20 by etching and the like.

Further, a mechanical strength of the partial discharge sensor 6 is improved.

Furthermore, assembling of the partial discharge sensor 6, and connections between the striplines 10a and 10b and the signal part 11a and ground part 11b of the connector 11 can be easily carried out.

As described above, according to Embodiment 4, because the components of the bowtie antenna 8 and the short stub 19 are disposed on the dielectric substrate 20, the components of the bowtie antenna 8 are formed to be flat, and thus can be easily formed on the dielectric substrate 20 by an etching process and the like.

Embodiment 5

Figure 19:
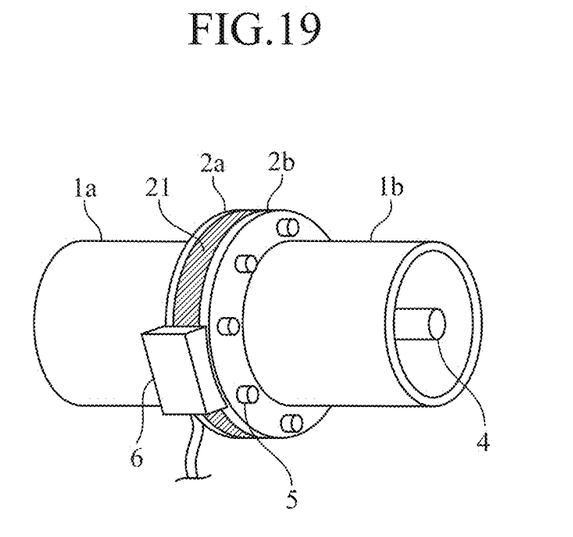
FIG. 19 is a perspective view showing a state where a partial discharge sensor is installed on a GIS according to Embodiment 5 of the invention.

FIG. 19 shows a state where a partial discharge sensor is installed on a GIS according to Embodiment 5 of the present invention.

Figure 20:
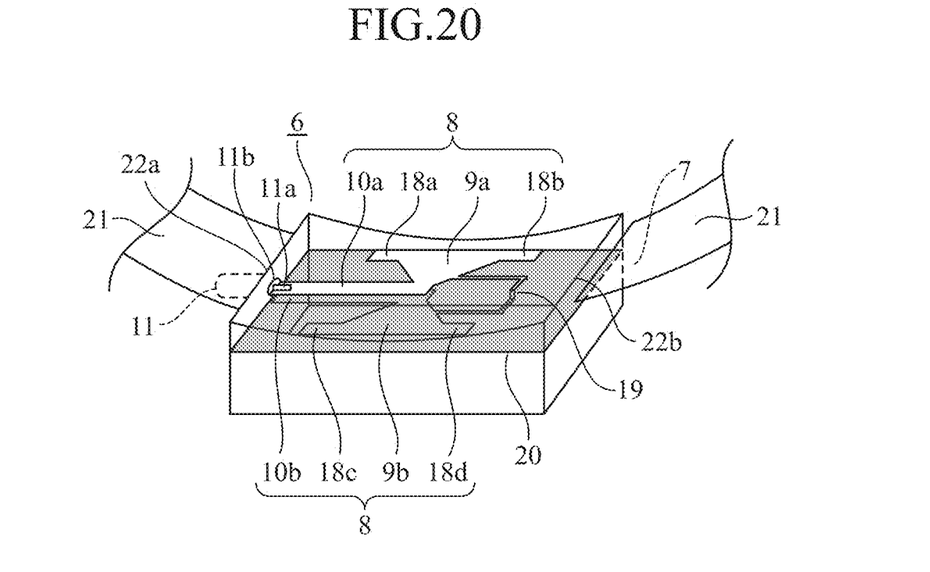
FIG. 20 is a perspective view showing a configuration of the partial discharge sensor according to Embodiment 5 of the invention.

FIG. 20 shows a configuration of the partial discharge sensor according to Embodiment 5 of the invention.

In the figures, a strip metal plate 21 covers the circumference of an insulating spacer 3 other than the opening of a metal casing 7, and is connected to connection parts 22a and 22b disposed on both sides of the metal casing 7 in the width direction such that the metal casing 7 is held on the outer side of flanges 2a and 2b.

The other components are the same as those shown in FIG. 18, and thus redundant descriptions thereof will be omitted.

Next, an operation thereof will be described.

Figure 21:
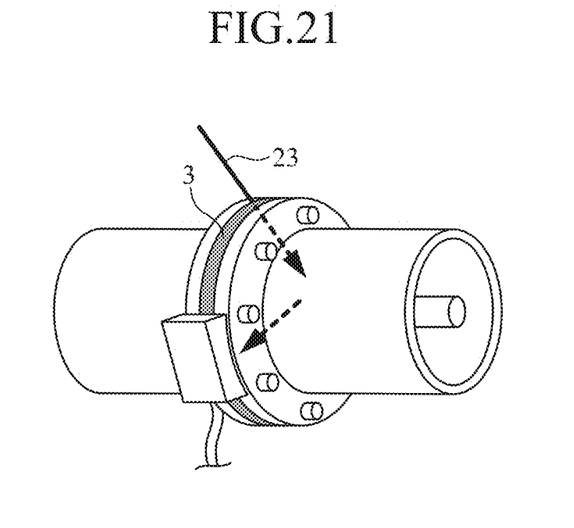
FIG. 21 is a perspective view showing a case where noise enters the GIS from the outside.

When the circumference of the insulating spacer 3 is not covered by the strip metal plate 21, FIG. 21 shows a case where the noise enters the GIS from the outside.

The slot openings 12 shown in FIG. 5 are disposed over the entire outer circumference of the flange 2a and 2b, and thus are also present at regions where the partial discharge senor 6 is not disposed.

As shown in FIG. 21, when external noise 23 reaches the regions, it enters the GIS through the slot opening 12. Because a large number of metal structures exist inside the GIS, the external noise 23 is irregularly reflected inside to reach the partial discharge sensor 6.

As a result, the signal from the partial discharge generated inside the GIS is buried in the external noise 23 generated outside the GIS. This causes a problem that the partial discharge cannot be detected.

In order to prevent this, it is effective that the regions where the partial discharge sensor 6 is not disposed are covered with metal.

The strip metal plate 21 of the partial discharge sensor 6 shown in FIG. 20 has one end connected previously to the connection part 22a prepared on the metal casing 7.

When the partial discharge sensor 6 is disposed on the outer side of the flanges 2a and 2b, the partial discharge sensor 6 is positioned on a desired slot opening 12 as shown in FIG. 19.

Next, the other end of the strip metal plate 21 is connected to the connection part 22b prepared on the metal casing 7 such that the circumference of the insulating spacer 3 is covered by the strip metal plate 21, and that the partial discharge sensor 6 is held at the set position.

As described above, according to Embodiment 5, because the strip metal plate 21 connected to the connection parts 22a and 22b prepared on the metal casing 7 is provided to cover the circumference of the insulating spacer 3 other than the opening of the metal casing 7, and also hold the partial discharge sensor 6 on the outer side of the flanges 2a and 2b, no external noise 23 of the GIS is propagated inside the insulating spacer 3 and received by the bowtie antenna 8. Thus, even when the wider band is achieved by the bowtie antenna 8, the signal caused by the partial discharge can be received at high sensitivity.

Moreover, the partial discharge sensor 6 can be easily held by the strip metal plate 21.

It is noted that according to the present invention, the embodiments can be freely combined, any components in each embodiment can be modified in any way, or any component in each embodiment can be omitted within the scope of the invention.

INDUSTRIAL APPLICABILITY

As described above, the partial discharge sensor according to the present invention is configured to include: the metal casing disposed on the outer side of the flanges, having the longitudinal direction in the circumferential direction of the flanges and also the width direction in the thickness direction of the insulating spacer, and having one surface opened on the side of the flanges; and the bowtie antenna disposed inside the metal casing, and disposed in the direction orthogonal to the circumferential direction of the flanges. Thus, it is suitable for use in high power equipment such as the GIS.

DESCRIPTION OF REFERENCE NUMERALS AND SIGNS 1a, 1b conductor tubes, 2a, 2b flanges, 3 insulating spacer, 4 high-voltage cable, 5 connection bolt, 6 partial discharge sensor, 7 metal casing, 8 bowtie antenna, 9a, 9b triangular conductors, 10a, 10b striplines, 11 connector, 11a signal part, 11b ground part, 12 slot opening, 13 resistance, 14 overlapping portion, 15 to 17 stray capacitances, 18a to 18d protruding conductors, 19 short stub (short-circuiting line), 20 dielectric substrate, 21 strip metal plate, 22a, 22b connection parts, 23 external noise.

The invention claimed is:

1. A partial discharge sensor detecting a partial discharge that occurs in high power equipment provided with:
a first conductor tube having a first flange formed on an end portion thereof;
a second conductor tube having a second flange formed on an end portion thereof;
an insulating spacer that is sandwiched between the first and the second flanges, and holds a high-voltage cable inside the first and the second conductor tubes;
a plurality of connection bolts that connect the first and the second flanges with each other,
the partial discharge sensor comprising:
a metal casing disposed on an outer side of the first and the second flanges, having a longitudinal direction in a circumferential direction of the first and the second flanges and also a width direction in a thickness direction of the insulating spacer, and having one surface opened on the side of the first and the second flanges; and
a bowtie antenna disposed inside the metal casing, and disposed in a direction orthogonal to the circumferential direction of the first and the second flanges, and having an overlapping portion with the first and the second flanges, and
a strip metal plate that covers a circumference of the insulating spacer other than an opening of the metal casing,
wherein the bowtie antenna includes a first triangular conductor disposed to have a base facing one side of the metal casing in the longitudinal direction and a second triangular conductor disposed to have a base facing the other side of the metal casing in the longitudinal direction.

2. The partial discharge sensor according to claim 1, wherein the bowtie antenna includes:
a first stripline that has one end connected to a vertex of the first triangular conductor and the other end connected to a signal part of a connector disposed in the metal casing; and
a second stripline that has one end connected to a vertex of the second triangular conductor and the other end connected to a ground part of the connector.

3. The partial discharge sensor according to claim 2, wherein in the bowtie antenna, a protruding conductor is disposed on both ends of the base of the first triangular conductor and on both ends of the base of the second triangular conductor.

4. The partial discharge sensor according to claim 2, wherein the bowtie antenna further comprises a short-circuiting line that has an electrical length that is a quarter wavelength at a frequency within a frequency band to be used and connects the first and second triangular conductors with each other.

5. The partial discharge sensor according to claim 1, wherein the metal casing is held on the outer side of the first and second flanges by the strip metal plate.

6. A partial discharge sensor detecting a partial discharge that occurs in high power equipment provided with:
a first conductor tube having a first flange formed on an end portion thereof;
a second conductor tube having a second flange formed on an end portion thereof;
an insulating spacer that is sandwiched between the first and the second flanges, and holds a high-voltage cable inside the first and the second conductor tubes;
a plurality of connection bolts that connect the first and the second flanges with each other,
the partial discharge sensor comprising:
a metal casing disposed on an outer side of the first and the second flanges, having a longitudinal direction in a circumferential direction of the first and the second flanges and also a width direction in a thickness direction of the insulating spacer, and having one surface opened on the side of the first and the second flanges; and
a bowtie antenna disposed inside the metal casing, and disposed in a direction orthogonal to the circumferential direction of the first and the second flanges,
wherein a length of the metal casing in the width direction corresponds to a length that is a sum of thicknesses of the first and second flanges and the insulating spacer, and
a strip metal plate that covers a circumference of the insulating spacer other than an opening of the metal casing,
wherein the bowtie antenna includes a first triangular conductor disposed to have a base facing one side of the metal casing in the longitudinal direction and a second triangular conductor disposed to have a base facing the other side of the metal casing in the longitudinal direction.

7. A partial discharge sensor detecting a partial discharge that occurs in high power equipment provided with:
a first conductor tube having a first flange formed on an end portion thereof;
a second conductor tube having a second flange formed on an end portion thereof;
an insulating spacer that is sandwiched between the first and the second flanges, and holds a high-voltage cable inside the first and the second conductor tubes;
a plurality of connection bolts that connect the first and the second flanges with each other,
the partial discharge sensor comprising:
a metal casing disposed on an outer side of the first and the second flanges, having a longitudinal direction in a circumferential direction of the first and the second flanges and also a width direction in a thickness direction of the insulating spacer, and having one surface opened on the side of the first and the second flanges; and
a bowtie antenna disposed inside the metal casing, and disposed in a direction orthogonal to the circumferential direction of the first and the second flanges, and formed on a dielectric substrate, and
a strip metal plate that covers a circumference of the insulating spacer other than an opening of the metal casing,
wherein the bowtie antenna includes a first triangular conductor disposed to have a base facing one side of the metal casing in the longitudinal direction and a second triangular conductor disposed to have a base facing the other side of the metal casing in the longitudinal direction.

8. A partial discharge sensor detecting a partial discharge that occurs in high power equipment provided with:
a first conductor tube having a first flange formed on an end portion thereof;
a second conductor tube having a second flange formed on an end portion thereof;
an insulating spacer that is sandwiched between the first and the second flanges, and holds a high-voltage cable inside the first and the second conductor tubes;

a plurality of connection bolts that connect the first and the second flanges with each other, the partial discharge sensor comprising:

a metal casing disposed on an outer side of the first and the second flanges, having a longitudinal direction in a circumferential direction of the first and the second flanges and also a width direction in a thickness direction of the insulating spacer, and having one surface opened on the side of the first and the second flanges; and a bowtie antenna disposed inside the metal casing, and disposed in a direction orthogonal to the circumferential direction of the first and the second flanges, wherein a length of the metal casing in the longitudinal direction corresponds to a distance between the connection bolts in the first and second flanges, and a strip metal plate that covers a circumference of the insulating spacer other than an opening of the metal casing, wherein the bowtie antenna includes a first triangular conductor disposed to have a base facing one side of the metal casing in the longitudinal direction and a second triangular conductor disposed to have a base facing the other side of the metal casing in the longitudinal direction.

\* \* \* \* \*